United States Patent
Koo et al.

(10) Patent No.: US 9,368,597 B2
(45) Date of Patent: Jun. 14, 2016

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Kyungbum Koo, Yongin-si (KR); Seungjae Lee, Hwaseong-si (KR); Shinhye Kim, Suwon-si (KR); Zulkamain, Yongin-si (KR); Narae Oh, Bucheon-si (KR); Jeong-Kyu Lee, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/660,191

(22) Filed: Mar. 17, 2015

(65) Prior Publication Data

US 2015/0333148 A1    Nov. 19, 2015

(30) Foreign Application Priority Data

May 14, 2014    (KR) .................. 10-2014-0057859

(51) Int. Cl.

| | |
|---|---|
| *H01L 21/283* | (2006.01) |
| *H01L 29/66* | (2006.01) |
| *H01L 29/423* | (2006.01) |
| *H01L 21/31* | (2006.01) |
| *H01L 21/3105* | (2006.01) |
| *H01L 21/311* | (2006.01) |
| *H01L 21/3213* | (2006.01) |

(Continued)

(52) U.S. Cl.
CPC ........ *H01L 29/66545* (2013.01); *H01L 21/283* (2013.01); *H01L 21/31* (2013.01); *H01L 21/31053* (2013.01); *H01L 21/31055* (2013.01); *H01L 21/31111* (2013.01); *H01L 21/32133* (2013.01); *H01L 21/768* (2013.01); *H01L 23/528* (2013.01); *H01L 27/1104* (2013.01); *H01L 29/4232* (2013.01); *H01L 29/78* (2013.01)

(58) Field of Classification Search
CPC ............... H01L 29/4232; H01L 29/78; H01L 29/66553; H01L 29/6656; H01L 29/6681; H01L 23/528; H01L 27/1103; H01L 21/283; H01L 21/31; H01L 21/31055; H01L 21/31111; H01L 21/32133; H01L 21/31058; H01L 21/31116; H01L 21/31051; H01L 21/28141

See application file for complete search history.

(56) References Cited

U.S. PATENT DOCUMENTS

| | | |
|---|---|---|
| 6,828,219 B2 | 12/2004 | Yang et al. |
| 7,034,368 B2 | 4/2006 | Song |

(Continued)

*Primary Examiner* — Galina Yushina
(74) *Attorney, Agent, or Firm* — Myers Bigel & Sibley, P.A.

(57) ABSTRACT

Semiconductor devices and methods of manufacturing the semiconductor devices are provided. The methods may include forming a sacrificial gate pattern on a substrate, forming a first spacer on a sidewall of the sacrificial gate pattern and forming a first interlayer dielectric (ILD) layer covering a sidewall of the first spacer and exposing a top surface of the first spacer. The first spacer may expose an upper portion of the sidewall of the sacrificial gate pattern. The methods may also include forming a capping insulating pattern covering top surfaces of the first spacer and the first ILD layer, replacing the sacrificial gate pattern with a gate electrode structure and patterning the capping insulating pattern to form a second spacer on the first spacer and between the gate electrode structure and the first ILD layer. The second spacer may be formed of a material having a dielectric constant higher than a dielectric constant of the first spacer.

15 Claims, 12 Drawing Sheets

(51) Int. Cl.
*H01L 21/768* (2006.01)
*H01L 29/78* (2006.01)
*H01L 27/11* (2006.01)
*H01L 23/528* (2006.01)

(56) References Cited

U.S. PATENT DOCUMENTS

| | | |
|---|---|---|
| 8,039,908 B2 | 10/2011 | Anderson et al. |
| 8,421,077 B2 | 4/2013 | Jain et al. |
| 2008/0029834 A1* | 2/2008 | Sell .................... H01L 29/4983 257/411 |
| 2012/0175709 A1 | 7/2012 | Cho |
| 2012/0264286 A1 | 10/2012 | Yeo |
| 2013/0178053 A1* | 7/2013 | Li ..................... H01L 21/76832 438/586 |
| 2013/0181265 A1* | 7/2013 | Grasshoff ......... H01L 21/76897 257/288 |
| 2013/0234253 A1 | 9/2013 | Toh et al. |
| 2013/0237045 A1 | 9/2013 | Kim et al. |
| 2014/0235019 A1* | 8/2014 | Tzeng .................. H01L 23/147 438/126 |
| 2015/0318178 A1* | 11/2015 | Pham ................ H01L 21/28247 257/288 |

\* cited by examiner

1200

SEMICONDUCTOR DEVICES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2014-0057859, filed on May 14, 2014, in the Korean Intellectual Property Office, the entire contents of which are hereby incorporated by reference.

BACKGROUND

The present disclosure generally relates to the field of electronics and, more particularly, to semiconductor devices.

Semiconductor devices are increasingly being used in consumer, commercial and other electronic devices. The semiconductor devices may be classified into a memory device for storing data, a logic device for processing data, and a hybrid device including both of memory and logic elements. Due to the increased demand for electronic devices with high speed and/or low power consumption, the semiconductor devices may need to provide high reliability, high performance, and/or multiple functions. To satisfy these technical requirements, complexity and/or integration density of semiconductor devices may increase.

SUMMARY

Some embodiments of the present inventive concept may provide a semiconductor device including a field effect transistor with improved electric characteristics, and a method of manufacturing the same.

According to example embodiments of the inventive concept, a method of manufacturing a semiconductor device may include forming a sacrificial gate pattern on a substrate, forming a first spacer on a sidewall of the sacrificial gate pattern, the first spacer exposing an upper portion of the sidewall of the sacrificial gate pattern, forming a first interlayer dielectric (ILD) layer to cover a sidewall of the first spacer and expose a top surface of the first spacer, the first ILD layer having a top surface that is lower than that of the sacrificial gate pattern and is higher than that of the first spacer, forming a capping insulating pattern to cover top surfaces of the first spacer and the first ILD layer, replacing the sacrificial gate pattern with a gate electrode structure, and patterning the capping insulating pattern to form a second spacer on the first spacer and between the gate electrode structure and the first ILD layer. The second spacer may be formed of a material having a dielectric constant higher than that of the first spacer.

In example embodiments, the forming of the capping insulating pattern may include forming a capping insulating layer to conformally cover top surfaces of the sacrificial gate pattern, the first ILD layer, and the first spacer, and performing a planarization process on the capping insulating layer to expose the top surface of the sacrificial gate pattern.

In example embodiments, the planarization process may be performed using an etch-back process or a chemical-mechanical polishing process.

In example embodiments, the capping insulating layer may include first and second portions positioned on the sacrificial gate pattern and the first ILD layer, respectively. In this case, the method may further include forming a protection insulating pattern on the second portion of the capping insulating layer. The protection insulating pattern protects the capping insulating layer during the planarization process.

In example embodiments, the gate electrode structure may include a gate electrode pattern and a gate capping pattern sequentially stacked on the substrate.

In example embodiments, the replacing the sacrificial gate pattern with the gate electrode structure may include removing the sacrificial gate pattern to form a gate trench exposing the substrate, forming a preliminary gate electrode pattern to fill the gate trench, recessing the preliminary gate electrode pattern to form the gate electrode pattern, and forming the gate capping pattern on the gate electrode pattern. The gate electrode pattern may be formed to have a top surface lower than that of the first spacer.

In example embodiments, the forming of the gate capping pattern may include forming a gate capping layer to fill the gate trench provided with the gate electrode pattern and cover a top surface of the capping insulating pattern, and planarizing the gate capping layer and the capping insulating pattern to expose the top surface of the first ILD layer.

In example embodiments, the second spacer may be formed by the planarizing of the gate capping layer and the capping insulating pattern.

In example embodiments, the gate capping pattern may be formed to have a top surface that is substantially coplanar with that of the first ILD layer.

In example embodiments, the method may further include forming a gate dielectric layer between the gate electrode pattern and the substrate and also between the gate electrode pattern and the first spacer.

In example embodiments, the method may further include forming epitaxial patterns on the substrate and at both sides of the sacrificial gate pattern, the epitaxial patterns having bottom surfaces lower than the top surface of the substrate.

In example embodiments, the method may further include forming a second ILD layer on the first ILD layer to cover the gate electrode structure, and forming contact plugs extending through the second and first ILD layers and connecting to the epitaxial patterns. The contact plugs may be in at least partial contact with the first and second spacers.

According to example embodiments of the inventive concept, a semiconductor device may include a gate electrode structure on a substrate, and a spacer structure on a sidewall of the gate electrode structure. The gate electrode structure may include a gate electrode pattern and a gate capping pattern sequentially stacked on the substrate, and the spacer structure may include first and second spacers sequentially stacked on the substrate. An interface between the first and second spacers may be positioned at a higher level than a top surface of the gate electrode pattern, and the second spacer may include a material having a higher dielectric constant than that of the first spacer.

In example embodiments, the semiconductor device may further include a gate dielectric layer provided between the gate electrode pattern and the substrate and between the gate electrode pattern and the first spacer.

In example embodiments, the semiconductor device may further include epitaxial patterns on the substrate and at both sides of the sacrificial gate pattern, the epitaxial patterns having bottom surfaces lower than a top surface of the substrate.

In example embodiments, the semiconductor device may further include contact plugs disposed at both sides of the gate electrode structure and connected to the epitaxial patterns, respectively. Each of the contact plugs may include a portion being in contact with the spacer structure.

According to example embodiments of the inventive concept, a method of manufacturing a semiconductor device may include forming a sacrificial gate pattern and a gate mask pattern sequentially stacked on a substrate; forming a first spacer to cover sidewalls of the sacrificial gate pattern and the gate mask pattern; forming a preliminary first ILD layer to cover a sidewall of the first spacer and expose a top surface of the gate mask pattern; etching the gate mask pattern and the first spacer to expose top and side surfaces of the sacrificial gate pattern and form a groove between the sacrificial gate structure and the preliminary first ILD layer; etching the preliminary first ILD layer to form a first ILD layer, whose top surface is positioned between top surfaces of the sacrificial gate pattern and the etched first spacer; conformally forming a capping insulating layer to fill the groove and extend to cover the top surfaces of the sacrificial gate pattern and the first ILD layer; and replacing the sacrificial gate pattern with a gate electrode structure. The capping insulating layer may include a material having a higher dielectric constant than that of the first spacer.

In example embodiments, the gate electrode structure may include a gate electrode pattern and a gate capping pattern sequentially stacked on the substrate, and the replacing of the sacrificial gate pattern may include performing a planarization process on the capping insulating layer to form a capping insulating pattern exposing the top surface of the sacrificial gate pattern; etching the exposed sacrificial gate pattern to form a gate trench exposing the substrate; and sequentially forming the gate electrode pattern and the gate capping pattern in the gate trench. The gate electrode pattern may have a top surface formed below an interface between the etched first spacer and the capping insulating layer.

In example embodiments, the forming of the gate electrode pattern may include forming a gate electrode layer to fill the gate trench; planarizing the gate electrode layer to expose the capping insulating pattern and form a preliminary gate electrode pattern in the gate trench; and recessing the preliminary gate electrode pattern.

In example embodiments, the forming of the gate capping pattern may include forming a gate capping layer to fill the gate trench provided with the gate electrode pattern and cover the capping insulating pattern and planarizing the gate capping layer and the capping insulating pattern to expose the first ILD layer. The gate capping pattern may be formed to have a top surface that is substantially coplanar with that of the first ILD layer.

In example embodiments, as a result of the planarizing of the gate capping layer and the capping insulating pattern, a portion of the capping insulating pattern serving as a second spacer may remain between the gate capping pattern and the first ILD layer.

Figure 1:
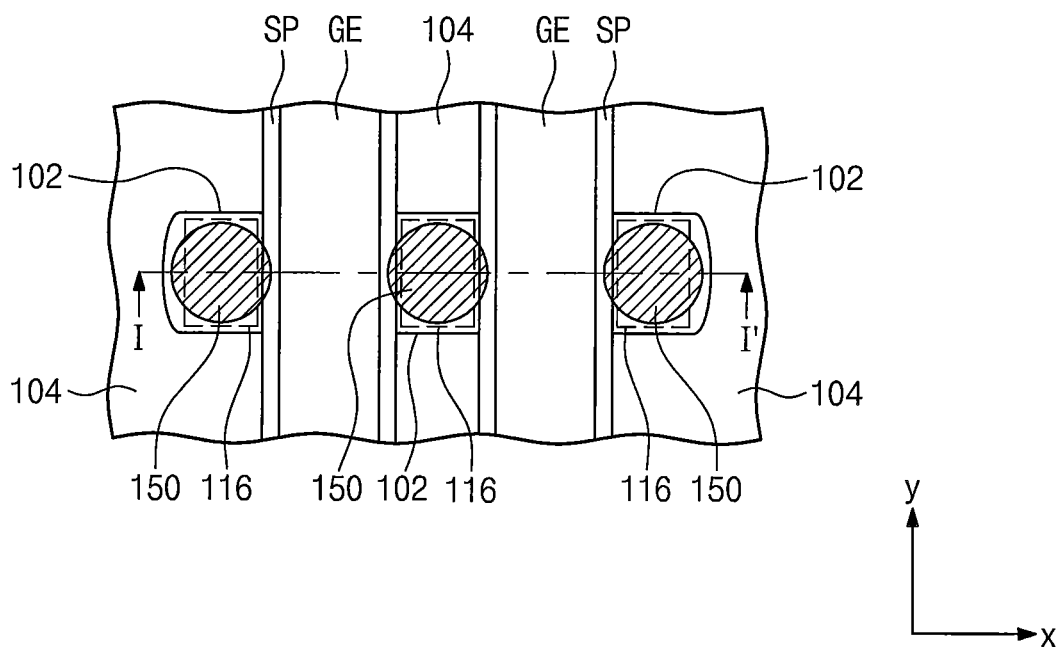
FIG. 1 is a plan view illustrating a semiconductor device according to example embodiments of the inventive concept.

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings may be intended to indicate the presence of a similar or identical element or feature.

DETAILED DESCRIPTION

Example embodiments of the inventive concept will now be described with reference to the accompanying drawings, in which example embodiments are shown. Example embodiments of the inventive concept may, however, be embodied in many different forms and should not be construed as being limited to the embodiments set forth herein, rather, these embodiments are provided so that this disclosure will be thorough and complete, and will fully convey the concept of example embodiments to those of ordinary skill in the art. In the drawings, thicknesses of layers or regions may be exaggerated for clarity. Like reference numerals in the drawings may denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations or plan view drawings that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a semiconductor device according to example embodiments of the inventive concept. FIGS. 2 through 17 are cross-sectional views taken along the line I-I' of FIG. 1 illustrating a method of manufacturing a semiconductor device according to example embodiments of the inventive concept.

Figure 2:
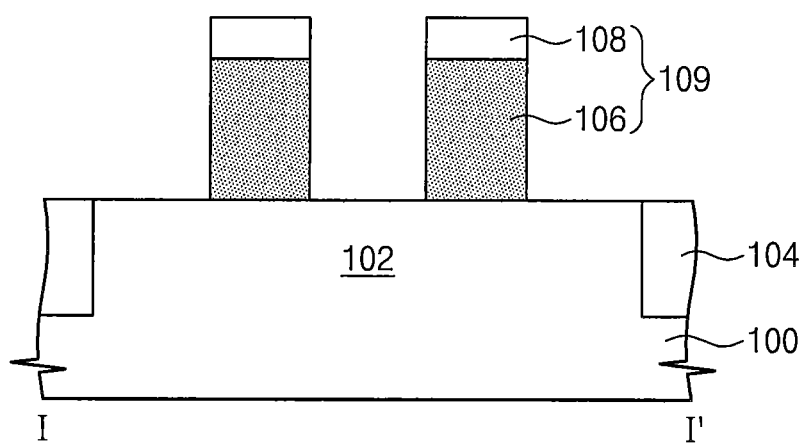
FIGS. 2 through 17 are cross-sectional views taken along the line I-I' of FIG. 1 illustrating a method of manufacturing a semiconductor device according to example embodiments of the inventive concept.

Referring to FIGS. 1 and 2, a device isolation pattern 104 may be formed on a substrate 100 to define an active region 102.

The substrate 100 may be or may include a semiconductor wafer, which is made of at least one of silicon, germanium, silicon-germanium, or semiconductor compound. The device isolation pattern 104 may be formed by a shallow trench isolation (STI) process. For example, the formation of the device isolation pattern 104 may include patterning the substrate 100 to form a trench and filling the trench with an insulating layer (e.g., silicon oxide). The active region 102 may be a portion of the substrate 100 defined or enclosed by the device isolation pattern 104. Although only one active region 102 is illustrated, a plurality of active regions 102 may be provided on the substrate 100. The plurality of active regions may be spaced apart from each other, when viewed in plan view, and each of them may have a bar or a line shape extending parallel to a first direction (hereinafter, an x direction). The active region 102 may be doped to have a first conductivity type.

A sacrificial gate structure 109 may be provided on the substrate 100. The sacrificial gate structure 109 may include a sacrificial gate pattern 106 and a gate mask pattern 108 that are sequentially stacked on the substrate 100. The sacrificial gate structure 109 may be shaped like a line or bar, which crosses the active region 102 and extends in a specific direction. For example, the sacrificial gate structure 109 may be formed by sequentially forming a sacrificial gate layer and a gate mask layer on the substrate 100 and patterning the sacrificial gate layer and the gate mask layer. In some embodiments, a plurality of sacrificial gate structures 109 may be provided to cross at least one of the active regions 102. For example, a pair of sacrificial gate structures 109 may be provided on at least one of the active regions 102, and they may be spaced apart from each other in the x direction and may extend parallel a second direction (hereinafter, y direction) crossing the x direction. The sacrificial gate layer may include a poly-silicon layer. The gate mask layer may include a silicon nitride layer or a silicon oxynitride layer.

Before the formation of the sacrificial gate layer, a pad oxide may be formed on the substrate 100. The pad oxide may be formed using a dry oxidation process, a wet oxidation process, or a radical oxidation process. For the sake of simplicity, the description that follows will refer to example embodiments in which a pair of sacrificial gate structures 109 are formed to be spaced apart from each other in the x direction and cross one active region 102.

Figure 3:
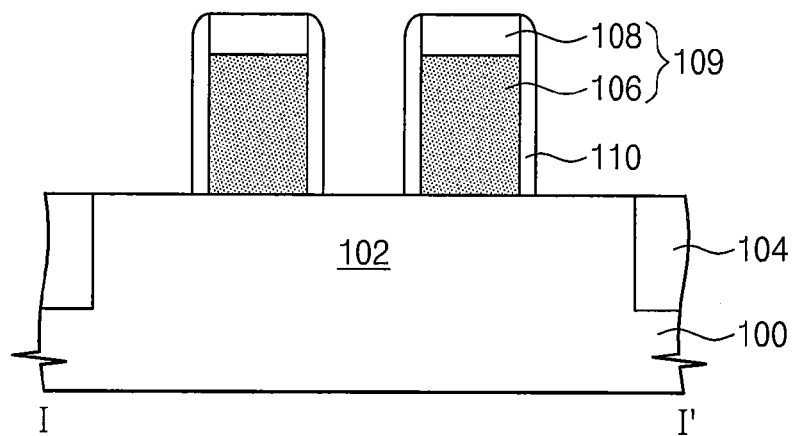

Referring to FIGS. 1 and 3, preliminary first spacers 110 may be formed on both sidewalls of each of the sacrificial gate structures 109. The formation of the preliminary first spacers 110 may include forming a preliminary first spacer layer conformally on the structure with the sacrificial gate structures 109 and performing an anisotropic etching process on the preliminary first spacer layer. Accordingly, the preliminary first spacers 110 may be formed to extend parallel to the sacrificial gate structures 109 or the y direction. The preliminary first spacer layer may be formed of or may include a low-k material. For example, the preliminary first spacer layer may be formed of or may include a low-k nitride layer (e.g., SiCN or SiCON).

Figure 4:
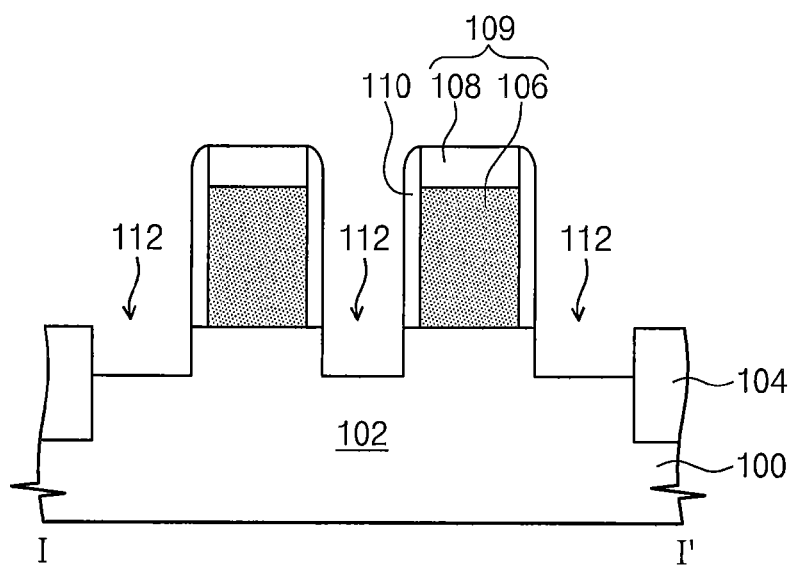

Referring to FIGS. 1 and 4, recess regions 112 may be formed in the active region 102. The recess regions 112 may be formed by selectively etching the active region 102 using the sacrificial gate structures 109 and the preliminary first spacers 110 as an etch mask. As a result, the active region 102 may have the recess regions 112 at both sides of each of the sacrificial gate structures 109. The recess regions 112 may have bottom surfaces that are positioned at a higher level than that of the device isolation pattern 104. In example embodiments, the etching of the active region 102 may include an anisotropic etching process. In example embodiments, the etching of the active region 102 may be isotropically performed using a wet etching process, and in this case, unlike the shown example, the recess regions 112 may extend below the sacrificial gate structures 109.

Figure 5:
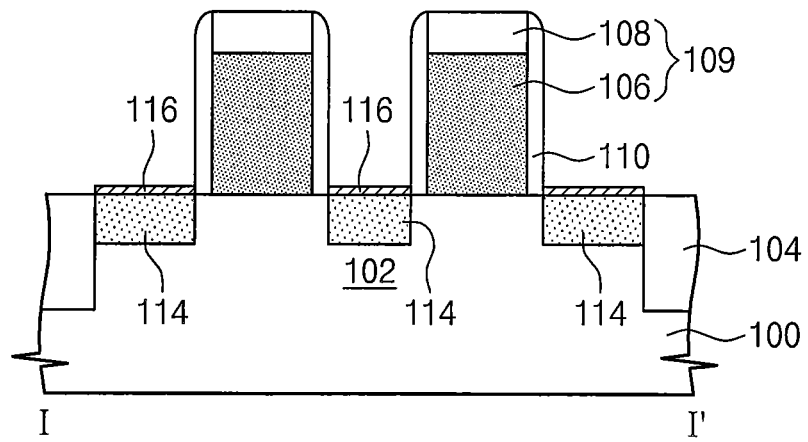

Referring to FIGS. 1 and 5, epitaxial patterns 114 may be formed in the recess regions 112, respectively. In example embodiments, the epitaxial patterns 114 may serve as source/drain regions of a field effect transistor.

For example, the epitaxial patterns 114 may be formed by a selective epitaxial growth process using the substrate 100 as a seed layer. The selective epitaxial growth process may include, for example, a chemical vapor deposition (CVD) process or a molecular beam epitaxy (MBE) process. Each of the epitaxial patterns 114 may be formed to fill, partially or entirely, a corresponding one of the recess regions 112. As shown, the epitaxial patterns 114 may have top surfaces that are substantially coplanar with the top surface of the active region 102, but in some embodiments, the top surfaces of the epitaxial patterns 114 may be higher than that of the active region 102. In addition, unlike the shown example, the top surface of the epitaxial pattern 114 may be formed to have a finite curvature. As an example, the epitaxial patterns 114 may be formed to have upward convex top surfaces.

The epitaxial patterns 114 may be formed of or may include a semiconductor material different from the substrate 100. For example, the epitaxial patterns 114 may be formed of or may include a semiconductor material having a lattice constant different from (for example, greater or smaller than) a lattice constant of the substrate 100. Accordingly, the epitaxial patterns 114 may exert a compressive or tensile stress on a channel region, which is a portion of the active region 102 positioned below the sacrificial gate structure 109. As an example, the substrate 100 may be a silicon wafer, and the epitaxial patterns 114 may be formed of or may include embedded silicon-germanium (e-SiGe) or germanium. In this case, a compressive stress may be exerted on the channel region, and the epitaxial patterns 114, on which such a compressive stress is exerted, may be used for PMOS field effect transistors. In some embodiments, the substrate 100 may be a silicon wafer, and the epitaxial patterns 114 may be formed of or may include silicon carbide (SiC). In this case, a tensile stress may be exerted on a channel region, and the epitaxial patterns 114, on which such a tensile stress is exerted, may be used for NMOS field effect transistors. The compressive or tensile stress exerted on the channel region may make it possible to improve mobility of carriers in the channel region, when the field effect transistors are operated.

The epitaxial patterns 114 may be doped to have a different conductivity type from that of the active region 102 or may have a second conductivity type. In example embodiments, the doping of the epitaxial patterns 114 may be performed in an in-situ manner, when the epitaxial patterns 114 are formed. In example embodiments, the doping of the epitaxial patterns 114 may be performed using an ion implantation process, after the formation of the epitaxial patterns 114.

Semiconductor capping patterns 116 may be formed on top surfaces of the epitaxial patterns 114, respectively. In some embodiments, the semiconductor capping patterns 116 may be in direct contact with source/drain regions of a field effect transistor. The semiconductor capping patterns 116 may be formed of or may include the same semiconductor element as the substrate 100 or the epitaxial patterns 114. For example, the semiconductor capping patterns 116 may be formed of or may include silicon or silicon-germanium. Each of the semiconductor capping patterns 116 may be a double-layered structure including a silicon layer and a silicon-germanium layer. In example embodiments, the semiconductor capping patterns 116 may be doped with elements different from dopants contained in the epitaxial patterns 114. For example, in the case where the epitaxial patterns 114 is formed of an e-SiGe layer, the semiconductor capping patterns 116 may be formed of a lightly Ge-doped layer and/or a highly B-doped layer. The B-doped layer may be formed by an ion implantation, plasma doping, or in-situ doping process. This may make it possible to reduce contact resistance between the semiconductor capping patterns 116 and the epitaxial patterns 114 (e.g., the source/drain regions.)

A metal silicide layer may be additionally formed on the semiconductor capping patterns 116. The metal silicide layer may be a result of reaction between semiconductor elements and metallic elements contained in the semiconductor capping patterns 116.

Figure 6:
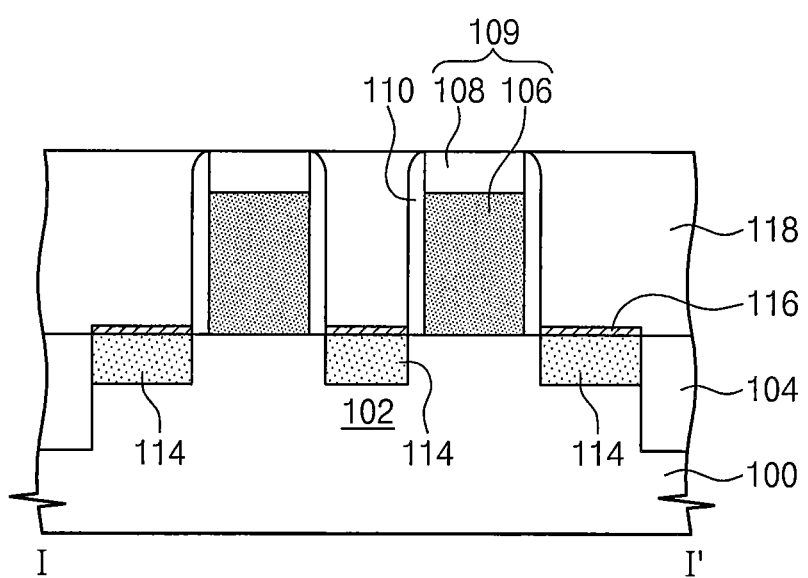

Referring to FIGS. 1 and 6, a preliminary first interlayer dielectric (ILD) layer 118 may be formed on the structure provided with the semiconductor capping patterns 116. The formation of the preliminary first ILD layer 118 may include forming an insulating layer to cover the structure provided with the semiconductor capping patterns 116 and planarizing the insulating layer to expose top surfaces of the sacrificial gate structures 109. The preliminary first ILD layer 118 may include a silicon oxide layer, which may be formed by, for example, a flowable chemical vapor deposition (FCVD) process. The planarization of the preliminary first ILD layer 118 may be performed using an etch-back process or chemical mechanical polishing (CMP) process.

Figure 7:
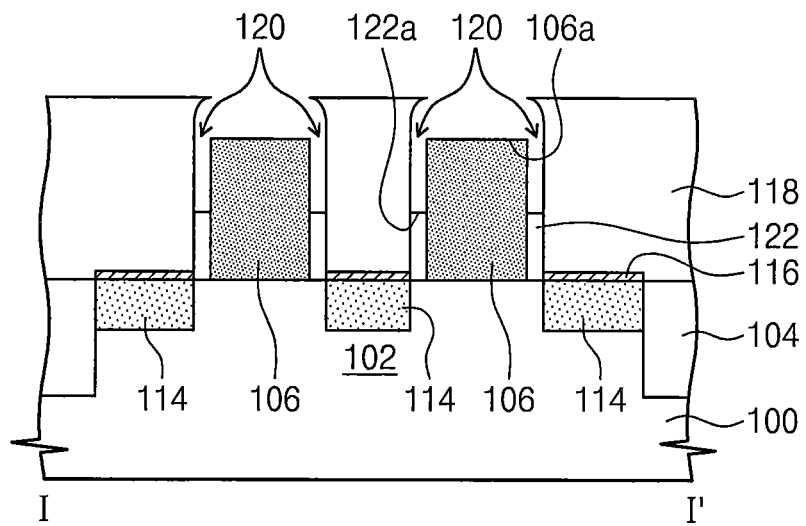

Referring to FIGS. 1 and 7, an etch-back process may be performed on the structure provided with the preliminary first ILD layer 118 to remove the gate mask patterns 108. In other words, an etch-back process may be performed to expose top surfaces of the sacrificial gate patterns 106. The etch-back process may include a dry and/or wet etching process. During the etch-back process, the preliminary first spacers 110 may be etched to form first spacers 122 exposing upper portions of sidewalls of the sacrificial gate patterns 106. Accordingly, grooves 120 may be formed between the sacrificial gate patterns 106 and the preliminary first ILD layer 118. For example, each of the first spacers 122 may be formed to have a top surface 112a that is lower than top surfaces 106a of the sacrificial gate patterns 106 adjacent thereto. A top level of the first spacer 122 or a depth of the groove 120 may be controlled by adjusting an etch amount in the etch-back process and/or a thickness of the gate mask patterns 108.

Figure 8:
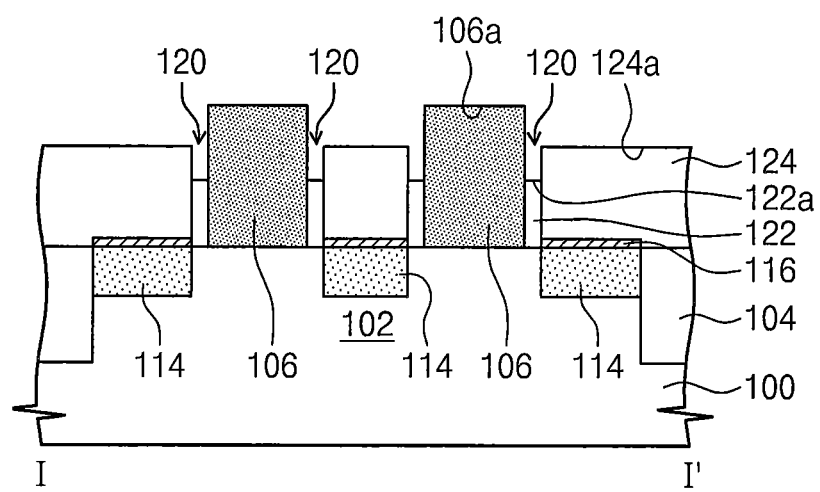

Referring to FIGS. 1 and 8, a first ILD layer 124 may be formed by etching the top surface of the preliminary first ILD layer 118 of FIG. 7.

The formation of the first ILD layer 124 may include performing a planarization process on the preliminary first ILD layer 118. The planarization process may be performed in such a way that the preliminary first ILD layer 118 has a top surface substantially coplanar with those of the sacrificial gate patterns 106. In example embodiments, a CMP process may be used in the planarization of the preliminary first ILD layer 118.

The formation of the first ILD layer 124 may further include performing an etching process to selectively etch the planarized top surface of the preliminary first ILD layer 118 in a vertical direction. For example, the etching process may be performed in such a way that the first ILD layer 124 has a top surface 124a that is lower than the top surface 106a of the sacrificial gate pattern 106. Here, the top surface 124a of the first ILD layer 124 may be higher than a top surface 122a of the first spacer 122. In other words, the top surface 124a of the first ILD layer 124 may be positioned between the top surface 122a of the first spacer 122 and the top surface 106a of the sacrificial gate pattern 106. The grooves 120 may be empty regions formed between the first ILD layer 124 and the sacrificial gate patterns 106.

Figure 9:
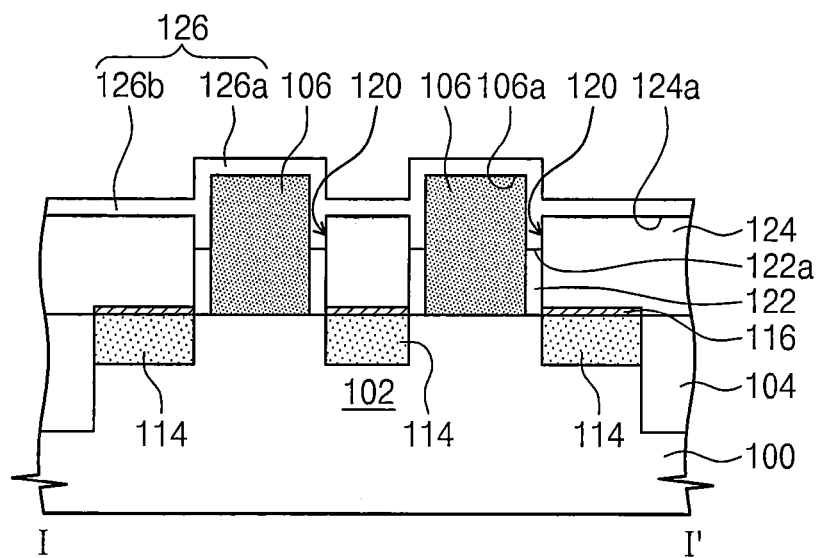

Referring to FIGS. 1 and 9, a capping insulating layer 126 may be conformally formed on the structure of FIG. 8 to fill the grooves 120. For example, the capping insulating layer 126 may cover the top surface 122a of the first spacer 122 and may also extend on and cover the top surface 106a of the sacrificial gate patterns 106 and the top surface 124a of the first ILD layer 124. The capping insulating layer 126 may include a first portion 126a covering the top surface 106a of the sacrificial gate patterns 106 and a second portion 126b covering the top surface 124a of the first ILD layer 124. The first portion 126a of the capping insulating layer 126 may be positioned at a higher level than the second portion 126b. In example embodiments, the capping insulating layer 126 may be formed of a material having a dielectric constant higher than the first spacer 122. For example, the capping insulating layer 126 may be formed of or may include a SiN layer. In example embodiments, in the case where the first spacer 122 is formed of a SiCN-containing layer, the capping insulating layer 126 may be formed of or may include a SiCN layer having a dielectric constant higher than a dielectric constant of the first spacer 122. Accordingly, the capping insulating layer 126 may have a high etch selectivity with respect to the first ILD layer 124 and a second ILD layer (e.g., 146 of FIG. 16) that will be formed in a subsequent process. For example, the capping insulating layer 126 may be formed by a chemical vapor deposition (CVD) process or an atomic layer deposition (ALD) process.

Figure 10:
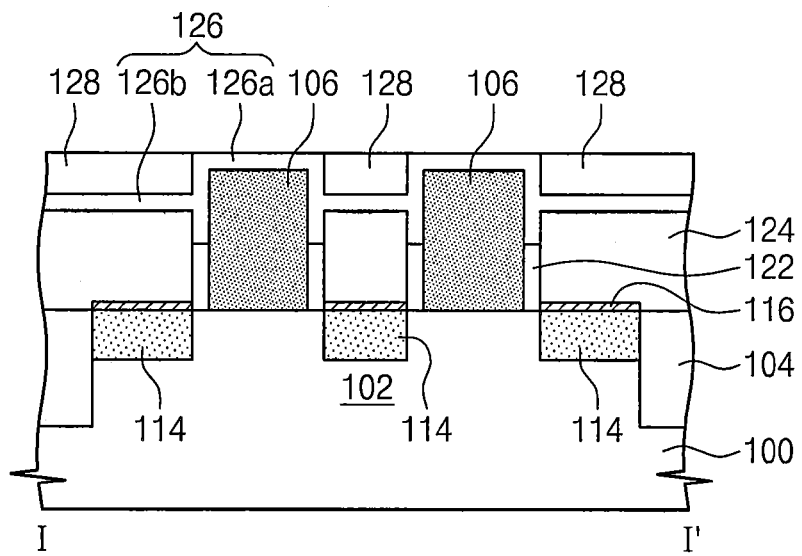

Referring to FIGS. 1 and 10, a protection insulating pattern 128 may be formed on the second portion 126b of the capping insulating layer 126. The formation of the protection insulating pattern 128 may include forming a protection insulating layer to conformally cover the capping insulating layer 126 and planarizing the protection insulating layer to expose the first portion 126a of the capping insulating layer 126. For example, the protection insulating layer may be formed of or may include a silicon oxide layer, which may be formed by a high-density plasma CVD (HDP-CVD) process. The planarization of the protection insulating layer may be performed by an etch-back process or CMP process.

Figure 11:
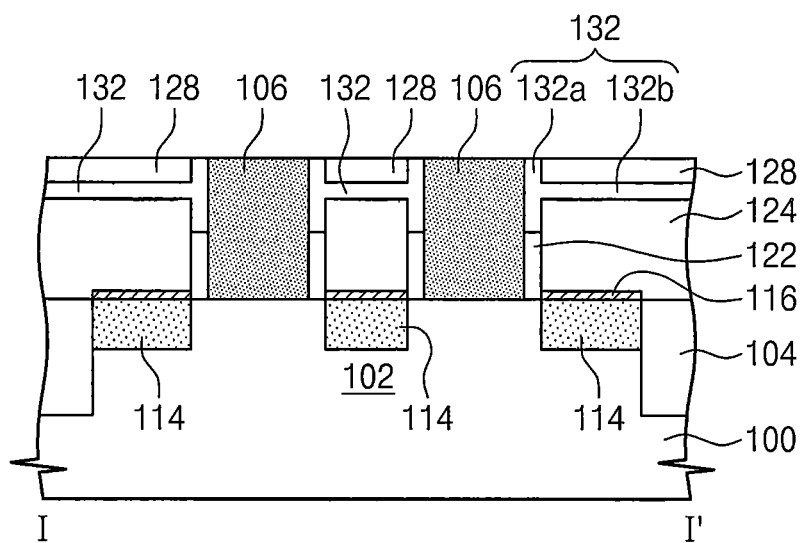

Referring to FIGS. 1 and 11, a planarization process may be performed to remove the first portion 126a of the capping insulating layer 126 and to expose the sacrificial gate patterns 106. Accordingly, the capping insulating layer 126 may be patterned to form capping insulating patterns 132 exposing the sacrificial gate patterns 106. The planarization of the capping insulating layer 126 may be performed by, for example, an etch-back process or CMP process. The planarization of the capping insulating layer 126 may be performed to remove a portion of the protection insulating pattern 128, and thus, other portions of the protection insulating pattern 128 may remain on the capping insulating patterns 132. The remaining portions of the protection insulating pattern 128 may reduce or possibly prevent the capping insulating patterns 132 thereunder from being etched in the planarization process. In other words, each of the capping insulating patterns 132 may include vertical portions 132a in contact with the sacrificial gate patterns 106 and a horizontal portion 132b interposed between the protection insulating pattern 128 and the first ILD layer 124.

Figure 12:
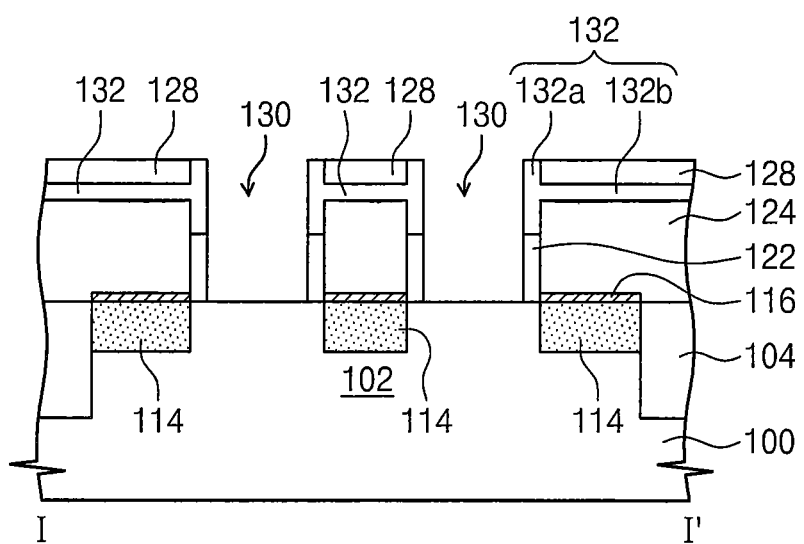

Referring to FIGS. 1 and 12, the sacrificial gate patterns 106 may be removed to form the gate trenches 130. The gate trenches 130 may be formed by an etching process of selectively removing the sacrificial gate patterns 106. The gate trenches 130 may be formed to expose the top surface of the substrate 100 and may extend parallel to the y direction.

Figure 13:
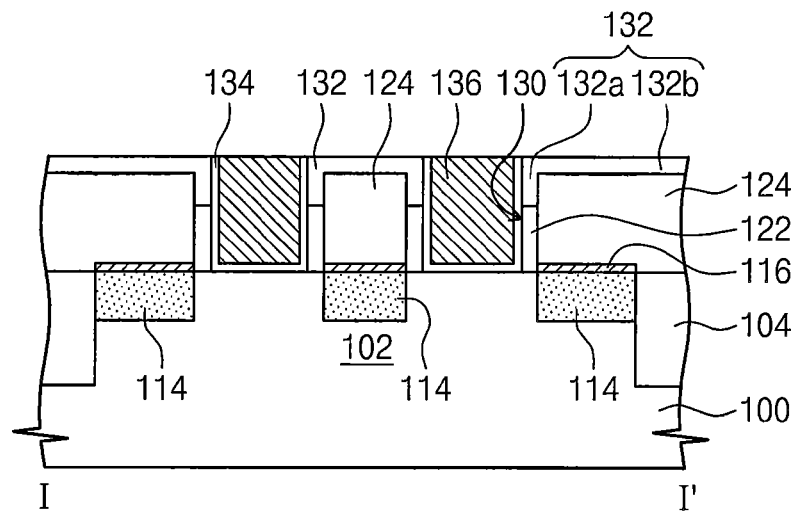

Referring to FIGS. 1 and 13, a gate dielectric layer 134 and a preliminary gate electrode pattern 136 may be formed in each of the gate trenches 130.

The gate dielectric layer 134 may be formed to cover, partially or entirely, the structure provided with the gate trenches 130. The gate dielectric layer 134 may be formed conformally on the structure of FIG. 12, and a thickness of the gate dielectric layer 134 may be thin such that the gate dielectric layer 134 may not entirely fill the gate trenches 130. In other words, the gate dielectric layer 134 may be formed to cover bottom surfaces of the gate trenches 130, sidewalls of the gate trenches 130, and the top surface of the protection insulating pattern 128. The gate dielectric layer 134 may be formed by an ALD process or a chemical oxidation process. In example embodiments, the gate dielectric layer 134 may include a high-k material. For example, the gate dielectric layer 134 may be formed of or may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Thereafter, a gate electrode layer may be formed to fill, partially or entirely, the gate trenches 130 provided with the gate dielectric layer 134 and may be planarized to expose the top surface of the capping insulating pattern 132. Accordingly, the gate dielectric layer 134 and the preliminary gate electrode pattern 136 may be locally formed in each of the gate trenches 130. The gate dielectric layer 134 and the preliminary gate electrode pattern 136 may extend parallel to the y direction. In example embodiments, the gate electrode layer may be formed of or may include at least one of conductive metal nitrides (e.g., titanium nitride or tantalum nitride) or metals (e.g., titanium, tantalum, tungsten, copper, or aluminum). The gate electrode layer may be formed by a deposition process (e.g., a CVD or sputtering process). The planarization of the gate electrode layer may include a CMP process. As a result of the planarization process, the protection insulating pattern 128 may be removed, and the vertical and horizontal portions 132a and 132b of the capping insulating pattern 132 may have top surfaces that are substantially coplanar with each other. In some embodiments, the protection insulating pattern 128 may be completely removed.

Figure 14:
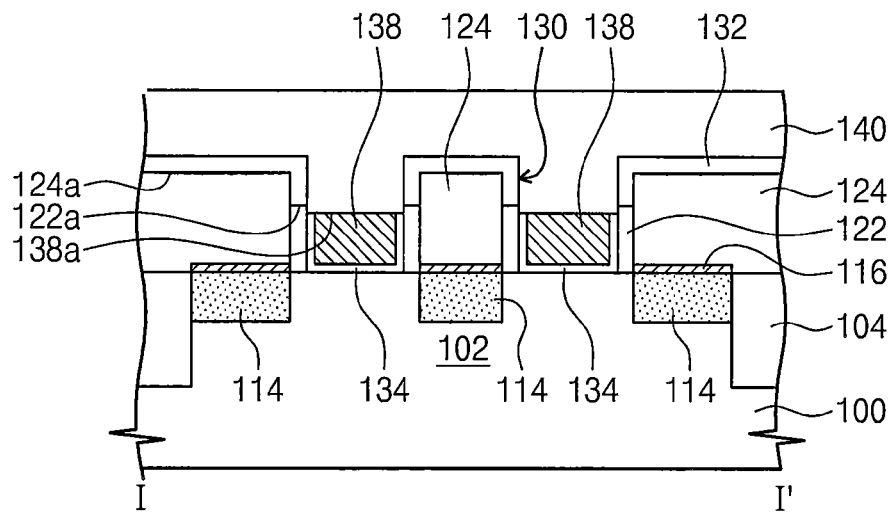

Referring to FIGS. 1 and 14, upper portions of the preliminary gate electrode patterns 136 may be removed to form gate electrode patterns 138.

For example, the gate electrode patterns 138 may be formed by selectively etching the upper portions of the preliminary gate electrode patterns 136. The etching process may be performed until top surfaces 138a of the gate electrode patterns 138 become lower than the top surface 122a of the first spacer 122. In other words, the top surfaces 138a of the gate electrode patterns 138 may be positioned below the top surface 122a of the first spacer 122. In example embodiments, a portion of the gate dielectric layer 134 positioned above the top surface 138a of the gate electrode pattern 138 may be removed, for example, after the formation of the gate electrode patterns 138. Accordingly, the gate dielectric layer 134 may be disposed between the gate electrode pattern 138 and the substrate 100 and between the gate electrode pattern 138 and the first spacers 122, as illustrated in FIG. 14. In some example embodiments, the gate dielectric layer 134 may remain on a surface of the capping insulating pattern 132 exposed by the formation of the gate electrode patterns 138. For example, the process of removing the gate dielectric layer 134 may be omitted after the formation of the gate electrode patterns 138.

Thereafter, the gate capping layer 140 may be formed to cover the top surfaces of the gate electrode patterns 138. The gate capping layer 140 may be formed to fill the gate trenches 130 provided with the gate electrode patterns 138 and cover the top surface of the capping insulating pattern 132. The gate capping layer 140 may be formed of a material having an etch selectivity with respect to the first ILD layer 124 and the second ILD layer (i.e., 146 of FIG. 16). As an example, the gate capping layer 140 may be formed of or may include a silicon nitride layer or a silicon oxynitride layer. The gate capping layer 140 may be formed by a CVD process.

Figure 15:
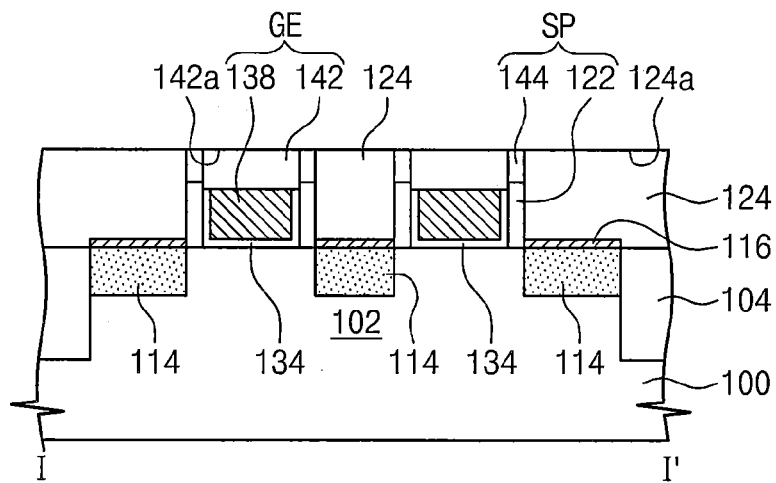

Referring to FIGS. 1 and 15, the gate capping layer 140 may be planarized to form gate capping patterns 142 and second spacers 144. The planarization of the gate capping layer 140 may include a CMP process. Further, the planarization of the gate capping layer 140 may performed to expose the top surface 124a of the first ILD layer 124. As a result of the planarization process, the gate capping patterns 142, which are portions of the gate capping layer 140, may be disposed on the gate electrode patterns 138, respectively, and the second spacers 144, which are portions of the capping insulating pattern 132, may be provided between the gate capping patterns 142 and the first ILD layer 124. The gate capping patterns 142 may extend parallel to the gate electrode patterns 138 or the y direction. The second spacers 144 may be formed on the first spacers 122, respectively, and may extend parallel to the first spacers 122 or the y direction. As a result of the planarization of the gate capping layer 140, the gate capping pattern 142 may have a top surface 142a that is substantially coplanar with the top surface 124a of the first ILD layer 124. The gate electrode pattern 138 and the gate capping pattern 142 may constitute a gate electrode structure GE, and the first spacer 122 and the second spacer 144 may constitute a spacer structure SP.

Figure 16:
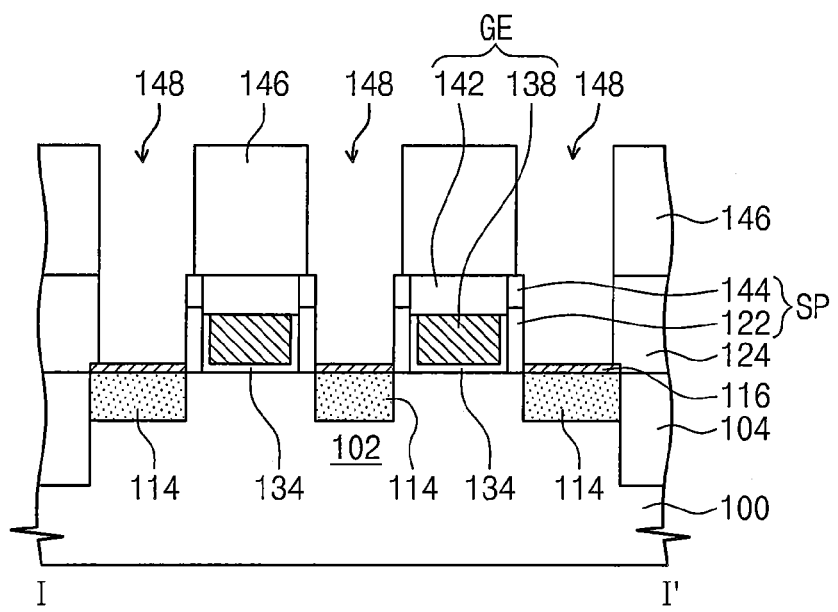

Referring to FIGS. 1 and 16, a second ILD layer 146 may be formed on the structure provided with the gate capping patterns 142 and the second spacers 144. The second ILD layer 146 may be formed of or may include a silicon oxide layer or a low-k oxide layer. For example, the low-k oxide layer for the second ILD layer 146 may include a carbon-doped silicon oxide layer (e.g., SiCOH). The second ILD layer may be formed by a CVD process.

Contact holes 148 may be formed to penetrate the second and first ILD layers 146 and 124 and may expose the top surfaces of the semiconductor capping patterns 116. The spacer structures SP may be at least partially exposed by the contact holes 148. For example, the contact holes 148 may be formed using the spacer structures SP as a portion of an etch mask, and thus, the contact holes 148 may have a self-align contact hole structure at least partially exposing the spacer structures SP. In detail, in some embodiments, the formation of the contact holes 148 may include forming a photoresist pattern on the second ILD layer 146 to define positions and dispositions of the contact holes 148 and anisotropically etching the second and first ILD layers 146 and 124 using the photoresist pattern as an etch mask. Since the second spacer 144 is formed of a material having a high etch selectivity with respect to the first and second ILD layers 124 and 146, the second spacer 144 may be etched at a very low etch rate during the anisotropic etching process, thereby remaining after the anisotropic etching process. As appreciated by the present inventors, if the entirety of the spacer structure SP is formed of a low-k material (for example, of the first spacer 122), the spacer structure SP may be etched during the formation of the contact hole 148, and thus, the gate electrode pattern 138 may be exposed by the contact hole 148. In other words, the self-align contact process cannot be used to form the contact hole 148, and this may lead to a reduction in integration density of the semiconductor device or a difficulty in reducing or possibly preventing the gate electrode pattern 138 from being unintentionally connected to the epitaxial patterns 114 serving as the source and drain regions. According to example embodiments of the inventive concept, the second spacer 144 stacked on the first spacer 122 may be formed of a material with a very low etch rate, when the anisotropic etching process for forming the contact hole 148 is performed. Accordingly, the second spacer 144 may protect the first spacer 122 during the anisotropic etching process, and thus, it may be possible to reduce or prevent the gate electrode pattern 138 from being exposed in the anisotropic etching process. The two stacked spacers of the spacer structure SP may make it possible to increase a process margin in the etching process for forming the contact hole 148.

Figure 17:
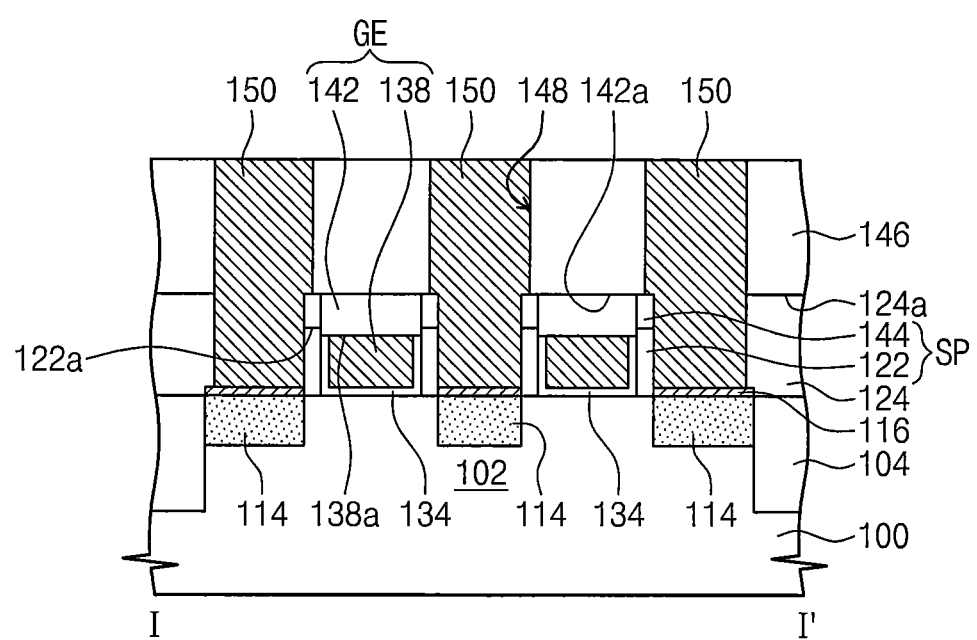

Referring to FIGS. 1 and 17, contact plugs 150 may be formed in the contact holes 148, respectively, and may be in contact with the semiconductor capping patterns 116, respectively. The contact plugs 150 may be in partial contact with the spacer structures SP. For example, each of the contact plugs 150 may be self-aligned to the spacer structure SP, thereby having a self-align contact plug structure. In example embodiments, the formation of the contact plugs 150 may include forming a conductive material layer filling, partially or entirely, the contact holes 148 and planarizing the conductive material layer to expose the top surface of the second ILD layer 146. The conductive material layer may be formed of or may include a metallic material (e.g., tungsten). In some embodiments, the conductive material layer may include a barrier metal layer (e.g., metal nitride) and a metal layer (e.g., tungsten), which are sequentially deposited on the structure including the contact holes 148.

Hereinafter, semiconductor devices according to example embodiments of the inventive concept will be described with reference to FIGS. 1 and 17. The semiconductor device according to example embodiments of the inventive concept may include the gate electrode structure GE provided on the substrate 100.

The substrate 100 may be or may include a semiconductor wafer, which is made of at least one of silicon, germanium, silicon-germanium, or semiconductor compound. The device isolation pattern 104 may be provided on the substrate 100 to define the active region 102. The device isolation pattern 104 may be formed of or may include an insulating layer (e.g., a silicon oxide layer). The active region 102 may be a portion of the substrate 100 defined or enclosed by the device isolation pattern 104. Although only one active region 102 is illustrated, a plurality of active regions 102 may be provided on the substrate 100. The plurality of active regions may be spaced apart from each other, when viewed in a plan view, and each of them may be shaped like a bar or a line extending parallel to the first direction or the x direction. The active region 102 may have a first conductivity type.

The gate electrode structure GE may include the gate electrode pattern 138 and the gate capping pattern 142 that are sequentially stacked on the substrate 100. In example embodiments, the gate electrode pattern 138 may be formed of a metallic material. For example, the gate electrode pattern 138 may include at least one of metal nitrides (e.g., titanium nitride or tantalum nitride) or metals (e.g., titanium, tantalum, tungsten, copper, or aluminum). The gate capping pattern 142 may include a material having an etch selectivity with respect to the first and second ILD layers 124 and 146. For example, the gate capping pattern 142 may include a silicon nitride layer or a silicon oxynitride layer.

The gate electrode structure GE may be shaped like a line or bar, which may cross the active region 102 and may extend in a specific direction. In example embodiments, a plurality of gate electrode structures GE may be provided to cross at least one of the active regions 102. As an example, a pair of the gate electrode structures GE may be provided on at least one of the active regions 102, and they may be spaced apart from each other in the x direction and may extend parallel to the second direction or the y direction crossing the x direction. In some embodiments discussed herein may include a pair of the gate electrode structures GE that are formed to be spaced apart from each other in the x direction and cross one active region 102.

The spacer structures SP may be provided on each sidewall of the gate electrode structures GE. The spacer structures SP may extend parallel to the gate electrode structures GE or the y direction. Each of the spacer structures SP may include the first spacer 122 and the second spacer 144 thereon. In other words, the spacer structure SP may be a double-layered structure including the first and second spacers 122 and 144 that are sequentially stacked on the substrate 100. The top surface 122a of the first spacer 122 may be higher than the top surface 138a of the gate electrode pattern 138. In other words, an interface 122a between the first and second spacers 122 and 144 may be positioned at a higher level than the top surface 138a of the gate electrode pattern 138.

The first spacer 122 may include a low-k material. For example, the first spacer 122 may be formed of or may include a low-k nitride layer (e.g., SiCN or SiCON). Since the low-k dielectric material is used for the first spacer 122, it is possible to reduce a parasitic capacitance between the gate electrode pattern 138 and the contact plug 150. The second spacer 144 may be formed of or may include a material having a dielectric constant higher than a dielectric constant of the first spacer 122. For example, the second spacer 144 may be formed of or may include a SiN layer. In example embodiments, in the case where the first spacer 122 is formed of a SiCN-containing layer, the second spacer 144 may be formed of or may include a SiCN layer, whose dielectric constant is higher than a dielectric constant of the first spacer 122. It will be understand that an etch rate of a material may decrease as a dielectric constant of the material increases. Accordingly, when an etching process is performed to etch the ILD layers 124 and 146, the second spacer 144 may have a etch rate slower than an etch rate of the first spacer 122.

The gate dielectric layer 134 may be disposed between the gate electrode pattern 138 and the substrate 100 and between the gate electrode pattern 138 and the first spacer 122. The gate dielectric layer 134 may extend along the gate electrode pattern 138 or parallel to the y direction. In example embodiments, the gate dielectric layer 134 may include a high-k material. For example, the gate dielectric layer 134 may be formed of or may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. In example embodiments, the gate dielectric layer 134 may extend along the sidewall of the first spacer 122 and may be interposed between the second spacer 144 and the gate capping pattern 142.

In example embodiments, each of the active regions 102 may have at least one recessed region, in which the epitaxial pattern 114 is provided. For example, each of the active regions 102 may have three recessed regions, which are formed between and beside a pair of the gate electrode structures GE, and the recessed regions may be filled with the epitaxial patterns 114, respectively. The epitaxial patterns 114 may serve as source/drain regions of a field effect transistor. The top surfaces of the epitaxial patterns 114 may be positioned at a level that is substantially equivalent to or higher than that of the active region 102. In example embodiments, as shown in FIG. 17, the epitaxial patterns 114 may have a flat top surface, but in example embodiments, the epitaxial patterns 114 may be provided to have a curved top surface with a finite curvature. As an example, the epitaxial patterns 114 may be formed to have upward convex top surfaces. Further, bottom surfaces of the epitaxial patterns 114 may be positioned above the bottom surface of the device isolation pattern 104.

The epitaxial patterns 114 may be formed of or may include a semiconductor material different from the substrate 100. For example, the epitaxial patterns 114 may be formed of or may include a semiconductor material having a lattice constant different from (for example, greater or less than) a lattice constant of the substrate 100. Accordingly, the epitaxial patterns 114 may exert a compressive or tensile stress on a channel region, which is a portion of the active region 102 positioned below the gate electrode structure GE. As an example, the substrate 100 may be a silicon wafer, and the epitaxial patterns 114 may be formed of or may include embedded silicon-germanium (e-SiGe) or germanium. In this case, a compressive stress may be exerted on the channel region, and the epitaxial patterns 114, on which such a compressive stress is exerted, may be used for PMOS field effect transistors. In some embodiments, the substrate 100 may be a silicon wafer, and the epitaxial patterns 114 may be formed of or may include silicon carbide (SiC). In this case, a tensile force may be exerted on a channel region, and the epitaxial patterns 114, on which such a tensile stress is exerted, may be used for NMOS field effect transistors. The compressive or tensile stress exerted on the channel region may make it possible to increase mobility of carriers in the channel region, when the field effect transistors are operated. The epitaxial patterns 114 may have a second conductivity type that is different from that of the active region 102.

The semiconductor capping pattern 116 may be provided on each of the epitaxial patterns 114. The semiconductor capping patterns 116 may be in direct contact with source/ drain regions of a field effect transistor. The semiconductor capping patterns 116 may include the same semiconductor element as the substrate 100 or the epitaxial patterns 114. For example, the semiconductor capping patterns 116 may be formed of or may include silicon or silicon-germanium. In some embodiments, each of the semiconductor capping patterns 116 may be a double-layered structure including a silicon layer and a silicon-germanium layer. In example embodiments, the semiconductor capping patterns 116 may be doped with elements different from dopants contained in the epitaxial patterns 114. For example, in the case where the epitaxial patterns 114 contains an e-SiGe layer, the semiconductor capping patterns 116 may be formed of a lightly Ge-doped layer and/or a highly B-doped layer. This makes it possible to reduce contact resistance between the semiconductor capping patterns 116 and the source/drain regions.

A metal silicide layer may be further provided on the semiconductor capping patterns 116. The metal silicide layer may be a result of reaction between semiconductor elements and metallic elements contained in the semiconductor capping patterns 116.

The first ILD layer 124 may be provided on the substrate 100. The first ILD layer 124 may have the top surface 124a that is substantially coplanar with the top surface 142a of the gate electrode structures GE. The first ILD layer 124 may include a silicon oxide layer. The second ILD layer 146 may be formed on the first ILD layer 124 and may cover the gate electrode structures GE. The second ILD layer 146 may be formed of or may include a silicon oxide layer or a low-k oxide layer. For example, the low-k oxide layer for the second ILD layer 146 may include a carbon-doped silicon oxide layer (e.g., SiCOH). A pad oxide may be further disposed between the substrate 100 and the first ILD layer 124. The pad oxide may be formed of, for example, a silicon oxide layer.

The contact plugs 150 may be provided on the substrate 100 to penetrate the first and second ILD layers 124 and 146 and may be in contact with the semiconductor capping patterns 116, respectively. When viewed in a plan view, the contact plugs 150 may be aligned with the semiconductor capping patterns 116 or the epitaxial patterns 114, respectively. The contact plugs 150 may be formed of or may include a metallic material (e.g., tungsten). In example embodiments, each of the contact plugs 150 may include a barrier metal layer (e.g., metal nitride) and a metal layer (e.g., tungsten) that are stacked on each of the epitaxial patterns 114.

According to example embodiments of the inventive concept, a field effect transistor may include the spacer structure SP including the first and second spacers 122 and 144 sequentially stacked on the substrate 100; that is, the field effect transistor may include a double-layered spacer structure. In example embodiments, the first spacer 122 may be formed of a low-k material, and this may make it possible to reduce a parasitic capacitance between the gate electrode pattern 138 and the contact plug 150. Further, the second spacer 144 may be formed of a material having a high etch selectivity with respect to the ILD layers 124 and 146, and thus, an etching process for forming the contact hole 148 may be performed with an increased process margin. As a result, it may be possible to provide a semiconductor device with improved performance and a fabrication process with an increased process margin.

Figure 18:
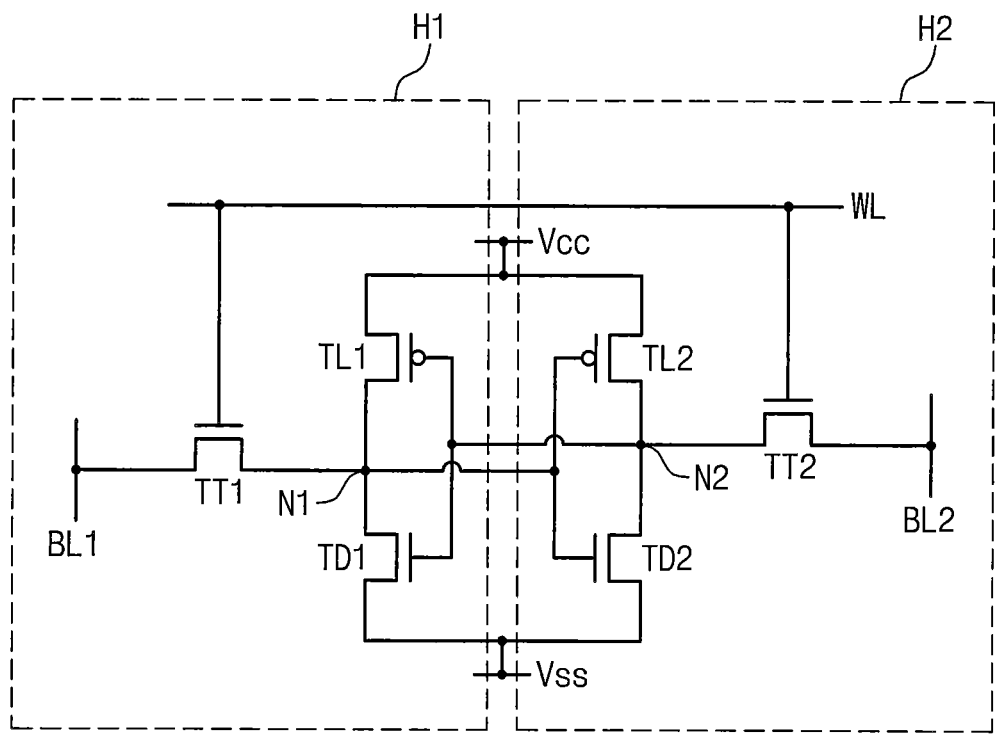
FIG. 18 is an equivalent circuit diagram of a CMOS SRAM cell including a semiconductor device according to example embodiments of the inventive concept.

FIG. 18 is an equivalent circuit diagram illustrating a CMOS SRAM cell including a semiconductor device according to example embodiments of the inventive concept. Referring to FIG. 18, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the driver, transfer, and load transistors TD1, TD2, TT1, TT2, TL1, and TL2 may be provided in the form of the field effect transistor according to example embodiments of the inventive concept.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

Example embodiments of the inventive concept may not be limited to the example of SRAM, and may be applied or modified to realize a logic device, DRAM, MRAM, other semiconductor devices, and manufacturing methods thereof.

Figure 19:
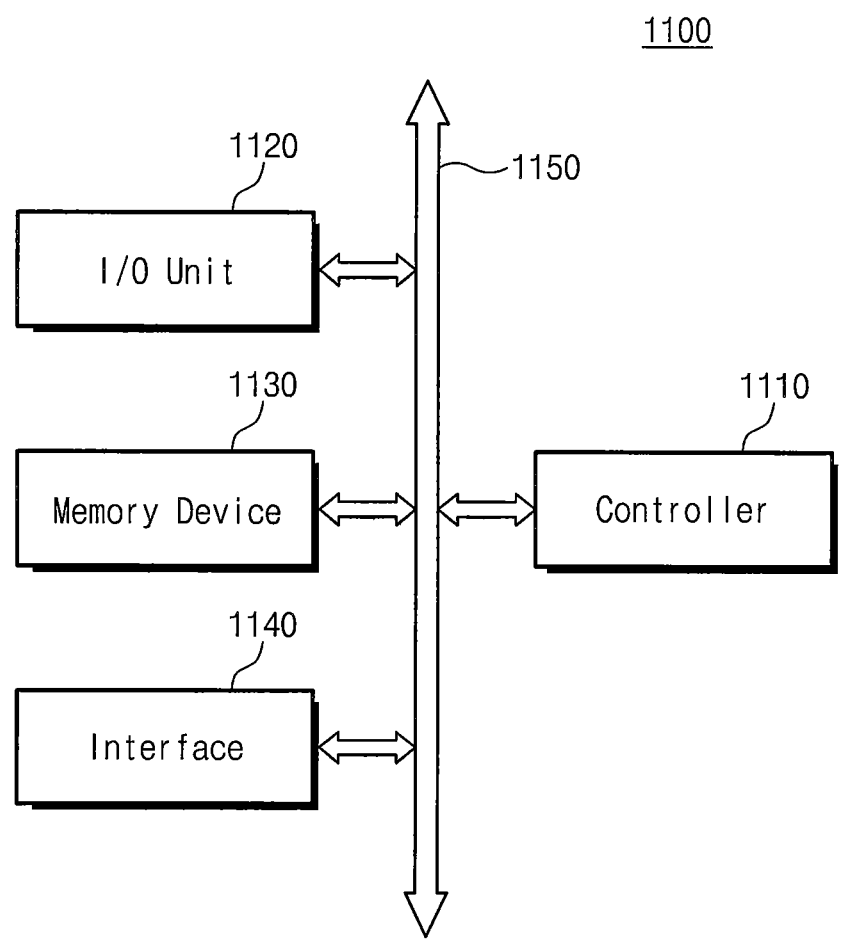
FIG. 19 is a schematic block diagram illustrating an example of electronic systems including a semiconductor device according to example embodiments of the inventive concept.

FIG. 19 is a schematic block diagram illustrating an example of electronic systems including a semiconductor device according to example embodiments of the inventive concept.

Referring to FIG. 19, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The logic devices may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided in the memory device 1130 or as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless.

Figure 20:
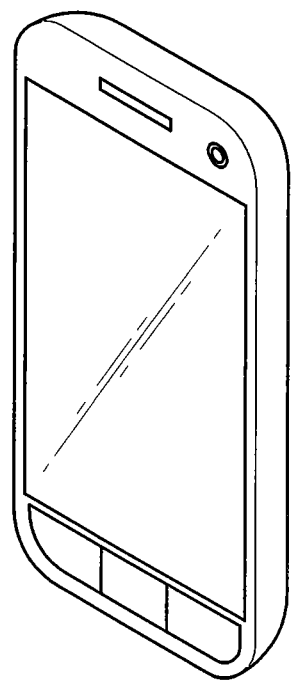
FIG. 20 is a perspective view of a mobile phone, which is illustrated as an example of an electronic system according to example embodiments of the inventive concept.

FIG. 20 is a schematic view illustrating an example of various electronic devices, to which the electronic system 1100 of FIG. 19 may be applied. As shown in FIG. 20, the electronic system 1100 of FIG. 19 may be applied to realize a mobile phone 1200. However, it will be understood that, in some embodiments, the electronic system 1100 of FIG. 19 may be applied to portable notebook computers, MP3 players, navigators, solid state disks (SSDs), automobiles, and/or household appliances.

According to example embodiments of the inventive concept, a field effect transistor of a semiconductor device may include a spacer structure including first and second spacers sequentially stacked on a substrate. In other words, the field effect transistor may include a double-layered spacer structure. Here, the first spacer may be formed of a low-k material, and this may make it possible to reduce a parasitic capacitance between a gate electrode and a contact plug. The second spacer may be formed of a material having a high etch selectivity with respect to an interlayer dielectric layer, and thus, a process of forming a contact hole may be performed with an increased process margin. As a result, it may be possible to provide a semiconductor device with improved performance and a fabrication process with an increased process margin.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a semiconductor device, comprising:
    forming a sacrificial gate pattern on a substrate;
    forming a first spacer on a sidewall of the sacrificial gate pattern, the first spacer exposing an upper portion of the sidewall of the sacrificial gate pattern;
    forming a first interlayer dielectric (ILD) layer covering a sidewall of the first spacer and exposing a top surface of the first spacer, the first ILD layer having a top surface that is lower than a top surface of the sacrificial gate pattern and is higher than the top surface of the first spacer;
    forming a capping insulating pattern covering the top surfaces of the first spacer and the first ILD layer;
    replacing the sacrificial gate pattern with a gate electrode structure; and
    patterning the capping insulating pattern to form a second spacer on the first spacer and between the gate electrode structure and the first ILD layer,
    wherein the second spacer is formed of a material having a dielectric constant higher than a dielectric constant of the first spacer,
    wherein forming the capping insulating pattern comprises:
    forming a capping insulating layer conformally covering the top surfaces of the sacrificial gate pattern, the first ILD layer, and the first spacer; and
    performing a planarization process on the capping insulating layer to expose the top surface of the sacrificial gate pattern,
    wherein the capping insulating layer comprises a first portion disposed on the sacrificial gate pattern and a second portion disposed on the first ILD layer,
    the method further comprises forming a protection insulating pattern on the second portion of the capping insulating layer,
    wherein the protection insulating pattern protects the capping insulating layer during the planarization process.

2. The method of claim 1, wherein the planarization process is performed using an etch-back process or a chemical-mechanical polishing process.

3. The method of claim 1, wherein the gate electrode structure comprises a gate electrode pattern and a gate capping pattern sequentially stacked on the substrate.

4. The method of claim 3, wherein replacing the sacrificial gate pattern with the gate electrode structure comprises:
    removing the sacrificial gate pattern to form a gate trench exposing the substrate;
    forming a preliminary gate electrode pattern in the gate trench;
    recessing the preliminary gate electrode pattern to form the gate electrode pattern; and
    forming the gate capping pattern on the gate electrode pattern,
    wherein the gate electrode pattern has a top surface lower than the top surface of the first spacer.

5. The method of claim 4, wherein forming the gate capping pattern comprises:
    forming a gate capping layer on the gate electrode pattern and covering a top surface of the capping insulating pattern; and
    planarizing the gate capping layer and the capping insulating pattern to expose the top surface of the first ILD layer.

6. The method of claim 5, wherein the second spacer is formed by planarizing the gate capping layer and the capping insulating pattern.

7. The method of claim 5, wherein the gate capping pattern has a top surface that is substantially coplanar with the top surface of the first ILD layer.

8. The method of claim 3, further comprising forming a gate dielectric layer between the gate electrode pattern and the substrate and between the gate electrode pattern and the first spacer.

9. The method of claim 1, further comprising forming epitaxial patterns on the substrate and near both sides of the sacrificial gate pattern, the epitaxial patterns having bottom surfaces lower than a top surface of the substrate.

10. The method of claim 9, further comprising:
    forming a second interlayer dielectric (ILD) layer on the first ILD layer, the second ILD layer covering the gate electrode structure; and forming contact plugs extending through the second and first ILD layers and being connected to the epitaxial patterns, wherein the contact plugs are in at least partial contact with the first and second spacers.

11. A method of manufacturing a semiconductor device, comprising:

forming a sacrificial gate pattern and a gate mask pattern sequentially stacked on a substrate;

forming a preliminary first spacer covering sidewalls of the sacrificial gate pattern and the gate mask pattern;

forming a preliminary first interlayer dielectric (ILD) layer covering a sidewall of the preliminary first spacer and exposing a top surface of the gate mask pattern;

etching the gate mask pattern and the preliminary first spacer to expose top and side surfaces of the sacrificial gate pattern and to form a groove between the sacrificial gate pattern and the preliminary first ILD layer and to form a first spacer from the preliminary first spacer;

etching the preliminary first ILD layer to form a first ILD layer after etching the gate mask pattern and the preliminary first spacer, the first ILD layer having a top surface that is disposed between the top surface of the sacrificial gate pattern and a top surface of the first spacer;

forming a capping insulating layer filling the groove and conformally covering the top surfaces of the sacrificial gate pattern and the first ILD layer;

forming a protection insulating pattern on the first ILD layer;

exposing the top surface of the sacrificial gate pattern while keeping the first ILD layer covered with the protection insulating pattern; and replacing the sacrificial gate pattern with a gate electrode structure, wherein the capping insulating layer comprises a material having a dielectric constant higher than a dielectric constant of the first spacer.

12. The method of claim 11, wherein the gate electrode structure comprises a gate electrode pattern and a gate capping pattern sequentially stacked on the substrate, and replacing the sacrificial gate pattern with a gate electrode structure comprises:

performing a planarization process on the capping insulating layer to form a capping insulating pattern exposing the top surface of the sacrificial gate pattern;

etching the sacrificial gate pattern to form a gate trench exposing the substrate; and sequentially forming the gate electrode pattern and the gate capping pattern in the gate trench, wherein the gate electrode pattern has a top surface disposed below an interface between the first spacer and the capping insulating pattern.

13. The method of claim 12, wherein forming the gate electrode pattern comprises:

forming a gate electrode layer in the gate trench and covering the capping insulating pattern;

planarizing the gate electrode layer to expose the capping insulating pattern and to form a preliminary gate electrode pattern in the gate trench; and recessing the preliminary gate electrode pattern.

14. The method of claim 13, wherein forming the gate capping pattern comprises:

forming a gate capping layer on the gate electrode pattern and covering the capping insulating pattern; and planarizing the gate capping layer and the capping insulating pattern to expose the first ILD layer, wherein the gate capping pattern has a top surface that is substantially coplanar with the top surface of the first ILD layer.

15. The method of claim 14, wherein planarizing the gate capping layer and the capping insulating pattern comprises forming a second spacer comprising a portion of the capping insulating pattern that remains between the gate capping pattern and the first ILD layer.

* * * * *